US012394735B2

(12) United States Patent
Chen et al.

(10) Patent No.: US 12,394,735 B2
(45) Date of Patent: Aug. 19, 2025

(54) SHIFTING CONTACT PAD FOR REDUCING STRESS

(71) Applicant: Taiwan Semiconductor Manufacturing Co., Ltd., Hsinchu (TW)

(72) Inventors: Chun-Jen Chen, Jhubei (TW); Wei-Chun Pai, Hsinchu (TW); Cheng Wei Ho, Taoyuan (TW); Sheng-Huan Chiu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 537 days.

(21) Appl. No.: 17/661,154

(22) Filed: Apr. 28, 2022

(65) Prior Publication Data

US 2023/0275047 A1    Aug. 31, 2023

Related U.S. Application Data

(60) Provisional application No. 63/268,516, filed on Feb. 25, 2022.

(51) Int. Cl.
*H01L 23/00* (2006.01)

(52) U.S. Cl.
CPC .............. *H01L 24/02* (2013.01); *H01L 24/03* (2013.01); *H01L 24/05* (2013.01); *H01L 24/13* (2013.01); *H01L 24/94* (2013.01); *H01L 24/04* (2013.01); *H01L 24/06* (2013.01); *H01L 24/11* (2013.01); *H01L 24/16* (2013.01); *H01L 24/32* (2013.01); *H01L 24/81* (2013.01); *H01L 24/92* (2013.01); *H01L 2224/02313* (2013.01); *H01L 2224/02331* (2013.01); *H01L 2224/0235* (2013.01); *H01L 2224/02373* (2013.01); *H01L 2224/02375* (2013.01); *H01L 2224/02381* (2013.01); *H01L 2224/0239* (2013.01);

(Continued)

(58) Field of Classification Search
CPC ....................................................... H01L 24/02
See application file for complete search history.

(56) References Cited

U.S. PATENT DOCUMENTS

| 11,107,771 | B2 | 8/2021 | Chun et al. |
| 11,276,647 | B2 | 3/2022 | Wang et al. |
| 11,302,649 | B2 | 4/2022 | Huang et al. |

(Continued)

FOREIGN PATENT DOCUMENTS

| DE | 102018109028 A1 | 1/2019 |
| DE | 102018110866 A1 | 10/2019 |

(Continued)

*Primary Examiner* — William A Harriston
(74) *Attorney, Agent, or Firm* — Slater Matsil, LLP

(57) ABSTRACT

A method includes forming a first polymer layer over a plurality of metal pads, and patterning the first polymer layer to forming a plurality of openings in the first polymer layer. The plurality of metal pads are exposed through the plurality of openings. A plurality of conductive vias are formed in the plurality of openings. A plurality of conductive pads are formed over and contacting the plurality of conductive vias. A conductive pad in the plurality of conductive pads is laterally shifted from a conductive via directly underlying, and in physical contact with, the conductive pad. A second polymer layer is formed to cover and in physical contact with the plurality of conductive pads.

20 Claims, 16 Drawing Sheets

(52) U.S. Cl.
CPC ............... *H01L 2224/03462* (2013.01); *H01L 2224/03464* (2013.01); *H01L 2224/0401* (2013.01); *H01L 2224/05008* (2013.01); *H01L 2224/05012* (2013.01); *H01L 2224/05015* (2013.01); *H01L 2224/05124* (2013.01); *H01L 2224/05147* (2013.01); *H01L 2224/05155* (2013.01); *H01L 2224/05166* (2013.01); *H01L 2224/05184* (2013.01); *H01L 2224/05558* (2013.01); *H01L 2224/05564* (2013.01); *H01L 2224/05569* (2013.01); *H01L 2224/05582* (2013.01); *H01L 2224/05647* (2013.01); *H01L 2224/06138* (2013.01); *H01L 2224/1146* (2013.01); *H01L 2224/13082* (2013.01); *H01L 2224/13124* (2013.01); *H01L 2224/13147* (2013.01); *H01L 2224/13155* (2013.01); *H01L 2224/13164* (2013.01); *H01L 2224/16148* (2013.01); *H01L 2224/16227* (2013.01); *H01L 2224/16238* (2013.01); *H01L 2224/32145* (2013.01); *H01L 2224/32225* (2013.01); *H01L 2224/81801* (2013.01); *H01L 2224/92125* (2013.01); *H01L 2224/94* (2013.01)

(56) References Cited

U.S. PATENT DOCUMENTS

| | | | |
|---|---|---|---|
| 11,652,037 | B2 | 5/2023 | Hsu et al. |
| 11,670,617 | B2* | 6/2023 | Chen ..................... H01L 23/473 257/751 |
| 11,855,017 | B2* | 12/2023 | Yang ....................... H01L 24/14 |
| 2011/0018128 | A1* | 1/2011 | Wei .................... H01L 21/76801 257/E21.294 |
| 2014/0021600 | A1* | 1/2014 | Daubenspeck ......... H01L 24/06 257/737 |
| 2015/0214127 | A1* | 7/2015 | Gu .......................... H01L 24/83 438/118 |
| 2020/0006141 | A1* | 1/2020 | Wang .................. H01L 23/3171 |
| 2022/0037248 | A1 | 2/2022 | Choi et al. |

FOREIGN PATENT DOCUMENTS

| | | |
|---|---|---|
| DE | 102020100946 A1 | 7/2021 |
| JP | 2008141036 A | 6/2008 |
| KR | 20180136870 A | 12/2018 |
| KR | 20200133549 A | 11/2020 |
| TW | 202207366 A | 2/2022 |
| TW | 202207396 A | 2/2022 |

\* cited by examiner

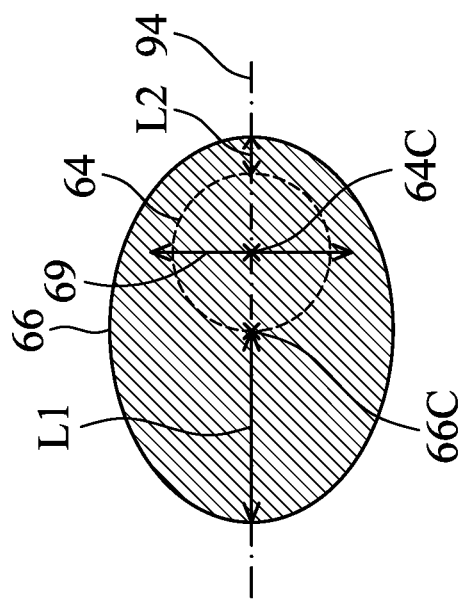
FIG. 11A
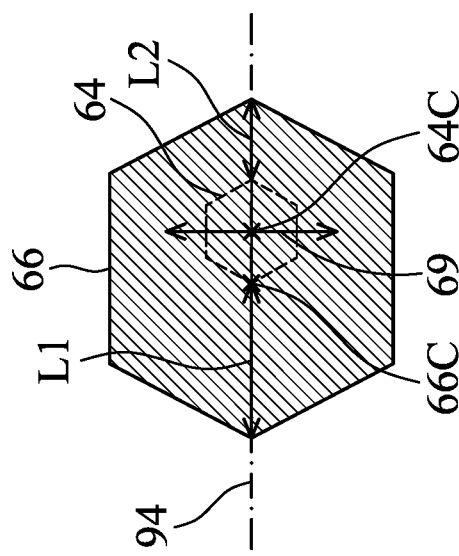
FIG. 11B
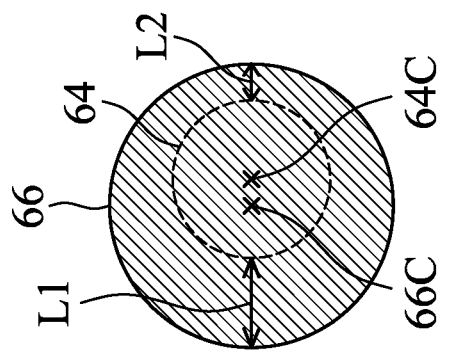
FIG. 11C
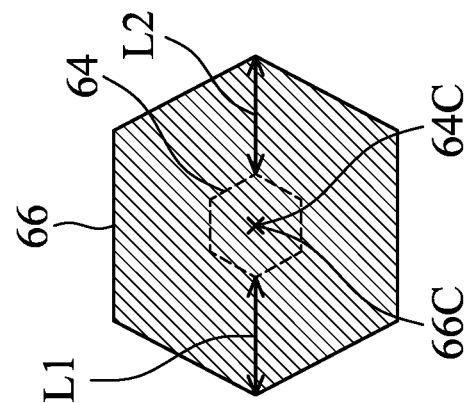
FIG. 11D
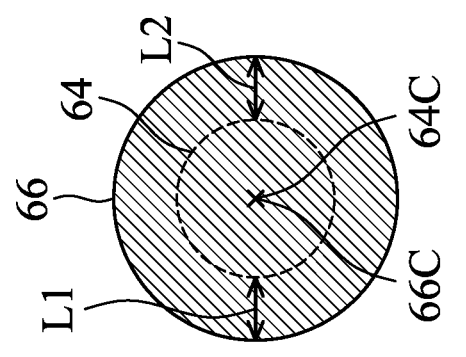
FIG. 11E
FIG. 11F

SHIFTING CONTACT PAD FOR REDUCING STRESS

PRIORITY CLAIM AND CROSS-REFERENCE

This application claims the benefit of the following provisionally filed U.S. patent application: Application No. 63/268,516, filed on Feb. 25, 2022, and entitled "Contact Pad and Passivation Layer Structure for Stress Release," which application is hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a polymer layer are formed over the metal pad, with the metal pad exposed through the openings in the passivation layer and the polymer layer. Electrical connectors are formed on the surface of the wafer. The wafer may then be sawed into dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A, 11B, 11C, 11D, 11E, and 11F illustrate the top views of some vias and conductive pads in accordance with some embodiments.

DETAILED DESCRIPTION

Figure 1:
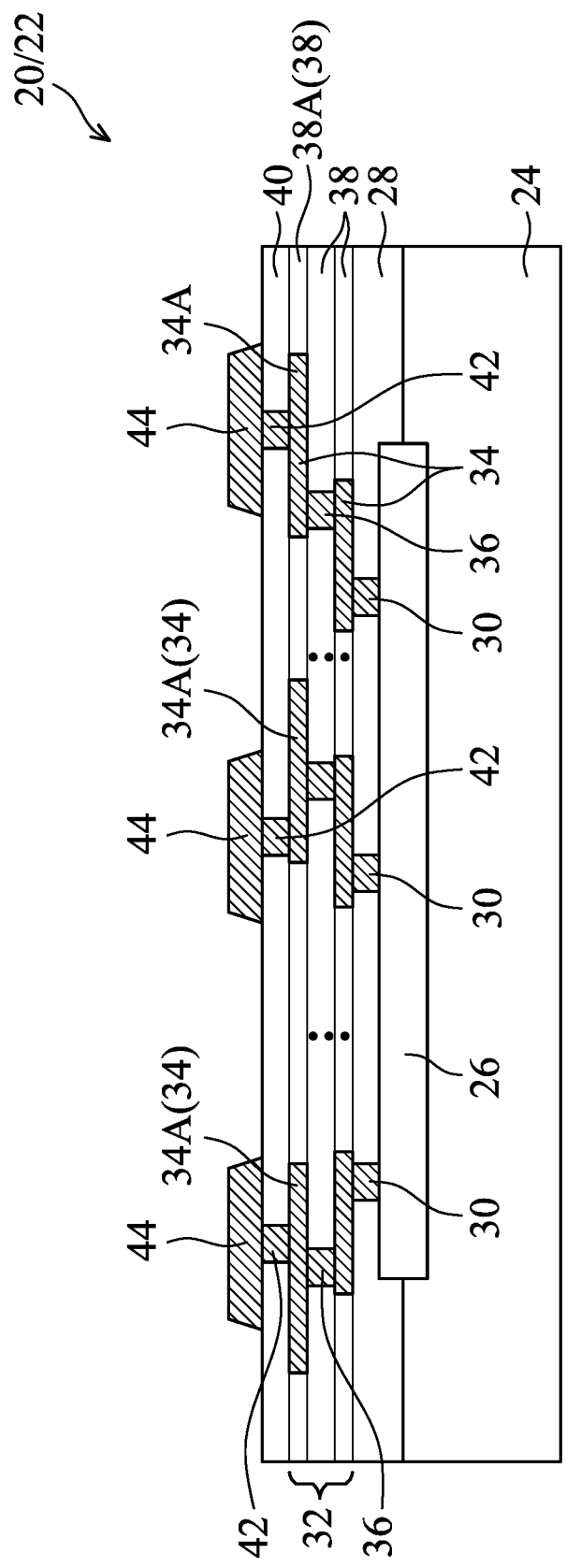
FIGS. 1-10 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package component and the method of forming the same are provided in accordance with some embodiments. The package component includes a via and a conductive pad over and contacting the via. The via and the conductive pad may be in a polymer layer. The conductive pad is laterally shifted (vertically misaligned) from the via, so that the conductive pad is larger on one side of the via than on its opposite side. With the conductive pad being laterally shifted from the via, the stress applied on the conductive pad and the via and on nearby dielectric layers may be released. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 16:
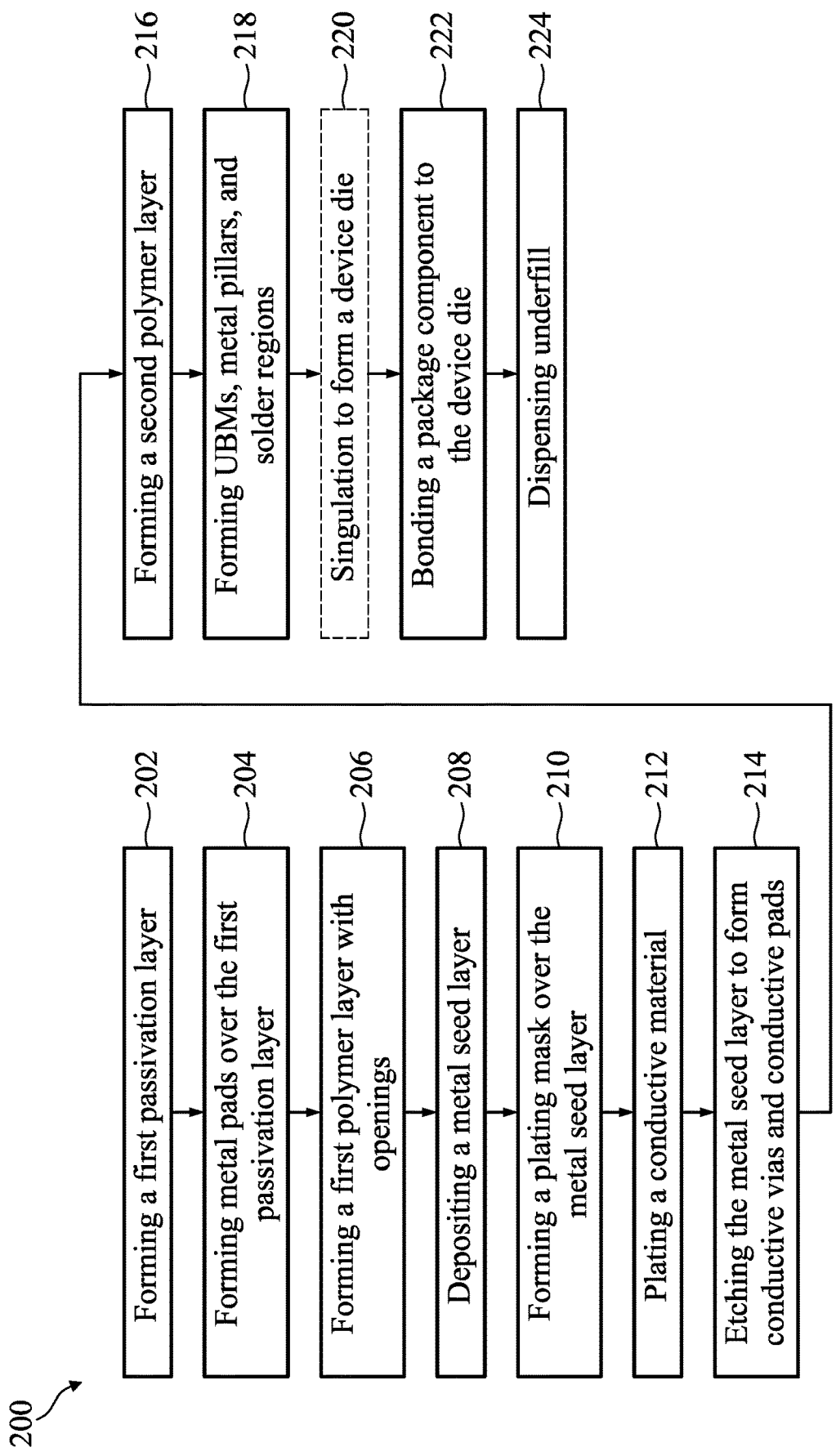
FIG. 16 illustrates a process flow for forming a package in accordance with some embodiments.

FIGS. 1 through 10 illustrate the cross-sectional views of intermediate stages in the formation of a package in accordance with some embodiments of the present disclosure. The corresponding processes are also reflected schematically in the process flow 200 as shown in FIG. 16. It is appreciated that although a device wafer and a device die therein are discussed as examples, the embodiments of the present disclosure may also be applied to the formation of conductive pads and vias in other devices (package components) including, and not limited to, package substrates, interposers, packages, and the like.

FIG. 1 illustrates a cross-sectional view of integrated circuit device 20. In accordance with some embodiments, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes coreless package substrates or cored package substrates having cores therein. In subsequent discussion, a device wafer is used as an example of device 20, and device 20 is accordingly referred to as wafer 20.

In accordance with some embodiments, wafer 20 includes semiconductor substrate 24 and the features formed at a top surface of semiconductor substrate 24. Semiconductor substrate 24 may be formed of or comprises crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of semiconductor substrate 24.

In accordance with some embodiments, wafer 20 includes integrated circuit devices 26, which are formed on the top surface of semiconductor substrate 24. Integrated circuit devices 26 may include transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, a low-k dielectric material, or the like. ILD 28 may be formed using spin coating, Flowable Chemical Vapor Deposition (FCVD), or the like. In accordance with some embodiments, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Interconnect structure 32 is formed over ILD 28 and contact plugs 30. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. Each of the damascene structures may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features (denoted as 34A) such as metal lines, metal pads, or vias. Top conductive features 34A are in a top dielectric layer (denoted as dielectric layer 38A), which is the top layer of dielectric layers 38. In accordance with some embodiments, top dielectric layer 38A is formed of a non-low-k dielectric material, which may include silicon nitride, Undoped Silicate Glass (USG), silicon oxide, or the like. In accordance with alternative embodiments, dielectric layer 38A is formed of a low-k dielectric material similar to the material of lower ones of dielectric layers 38. Dielectric layer 38A may also have a multi-layer structure including, for example, two USG layers and a silicon nitride layer in between. Top metal features 34A may also be formed of copper or a copper alloy, and may have a dual damascene structure or a single damascene structure.

Passivation layer 40 (sometimes referred to as passivation-1 or pass-1) is formed over interconnect structure 32. The respective process is illustrated as process 202 in the process flow 200 as shown in FIG. 16. In accordance with some embodiments, passivation layer 40 is formed of a non-low-k dielectric material having a dielectric constant greater than or equal to the dielectric constant of silicon oxide. Passivation layer 40 may be formed of or comprise an inorganic dielectric material, which may be selected from, and is not limited to, silicon nitride ($SiN_x$), silicon oxide ($SiO_2$), silicon oxy-nitride ($SiON_x$), silicon oxy-carbide ($SiOC_x$), silicon carbide (SiC), Un-doped Silicate Glass (USG), or the like, combinations thereof, and multi-layers thereof. The value "x" represents the relative atomic ratio.

Passivation layer 40 is patterned in an etching process, and vias 42 are formed in passivation layer 40 to contact top conductive features (metal lines) 34A. Vias 42 may be formed through a single damascene process in accordance with some embodiments.

Metal pads 44 are formed over and contacting vias 42. The respective process is illustrated as process 204 in the process flow 200 as shown in FIG. 16. Metal pads 44 may be electrically coupled to integrated circuit devices 26 through conductive features such as metal lines 34 and vias 36. In accordance with some embodiments, metal pads 44 are aluminum pads or aluminum-copper pads, while other metallic materials may be used. In accordance with some embodiments, metal pads 44 have an aluminum percentage greater than about 95 percent.

Figure 2:
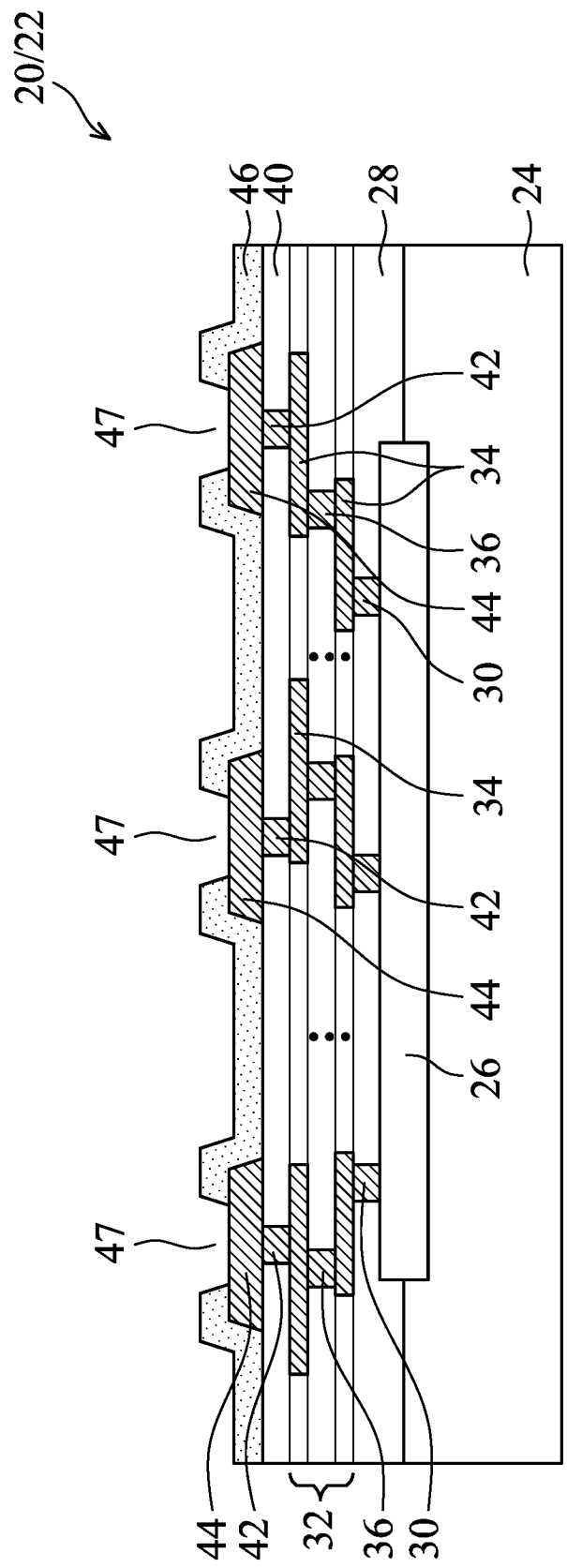

Referring to FIG. 2, passivation layer 46 is formed on metal pads 44. Passivation layer 46 may be a single layer or a composite layer, and may be formed of a non-porous material. In accordance with some embodiments, passivation layer 46 is a composite layer including a silicon oxide layer and a silicon nitride layer over the silicon oxide layer. Passivation layer 46 is then patterned through an etching process to form openings 47, so that passivation layer 46 may cover the edge portions of metal pads 44, and some portion of the top surfaces of metal pads 44 are exposed through openings 47.

Figure 3:
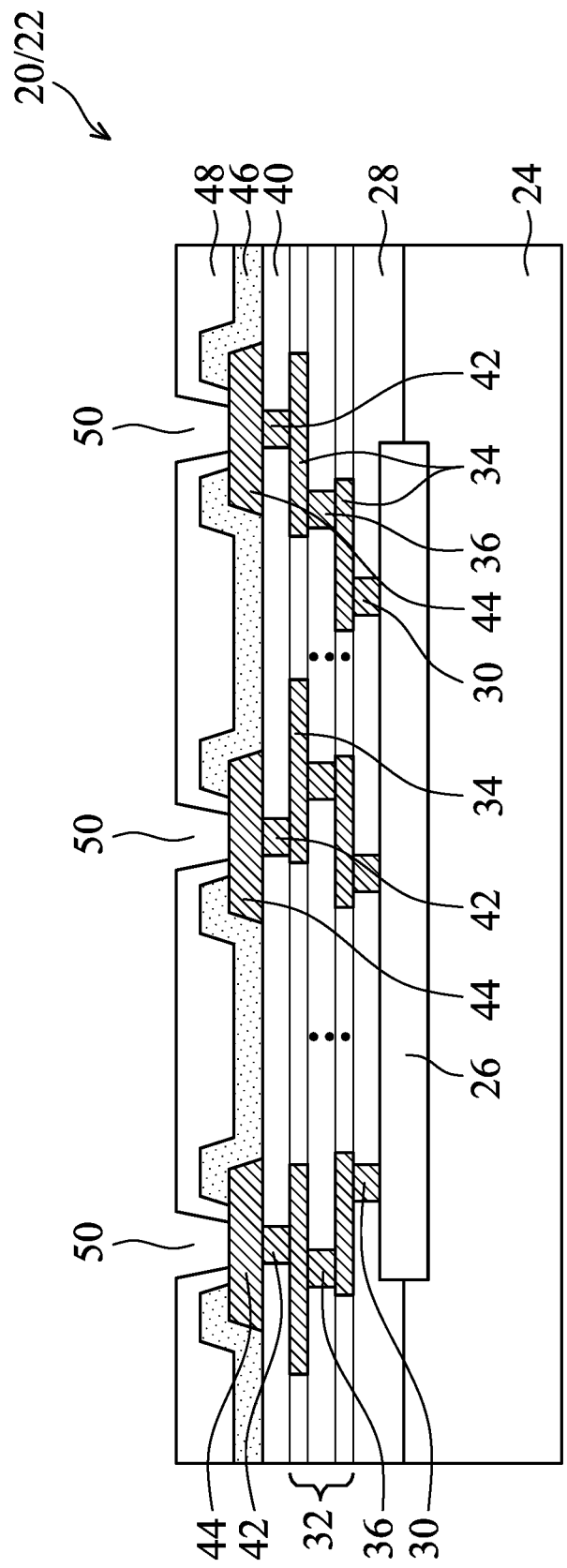

FIG. 3 illustrates the application of dielectric layer 48. In accordance with some embodiments, dielectric layer 48 comprises a polymer, which may include polyimide, polybenzoxazole (PBO), benzocyclobutene (BCB), or the like. Accordingly, dielectric layer 48 is alternatively referred to as polymer layer 48, while it may also be formed of or comprises other dielectric materials such as inorganic dielectric materials. The respective process is illustrated as process 206 in the process flow 200 as shown in FIG. 16. The formation of polymer layer 48 may include spin-coating and then curing polymer layer 48. Openings 50 are formed in polymer layer 48.

Figure 4:
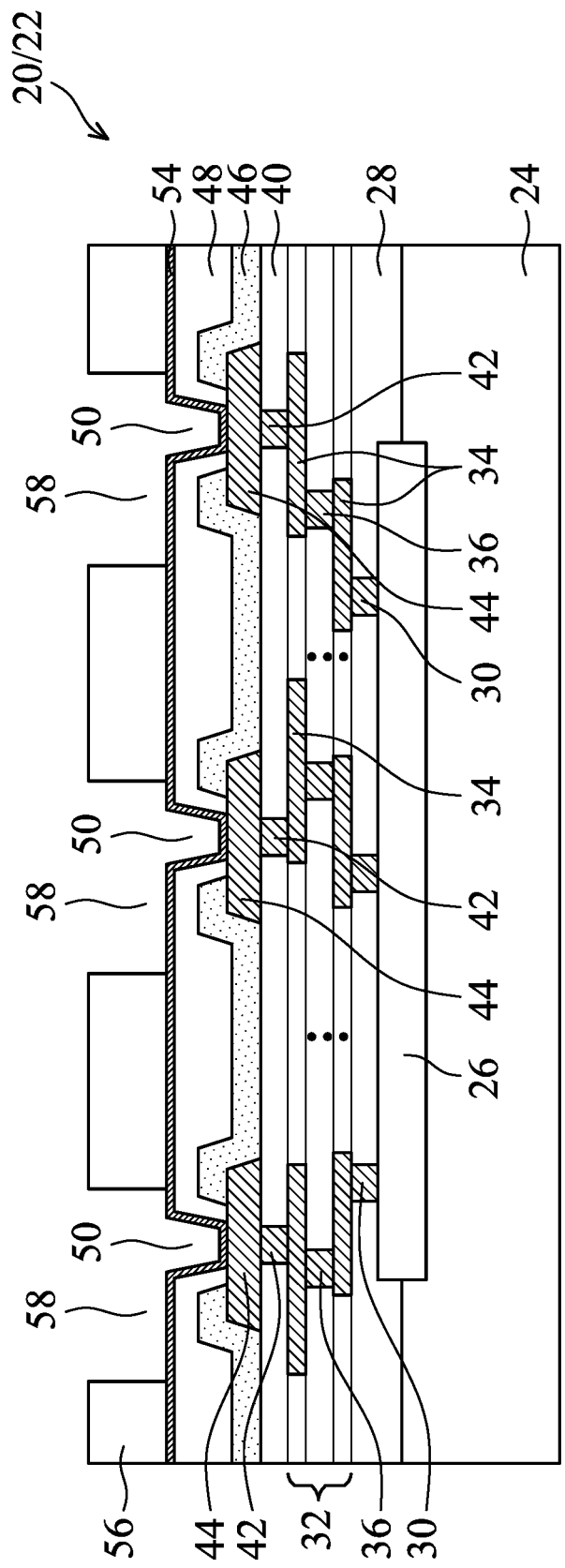
Figure 5:
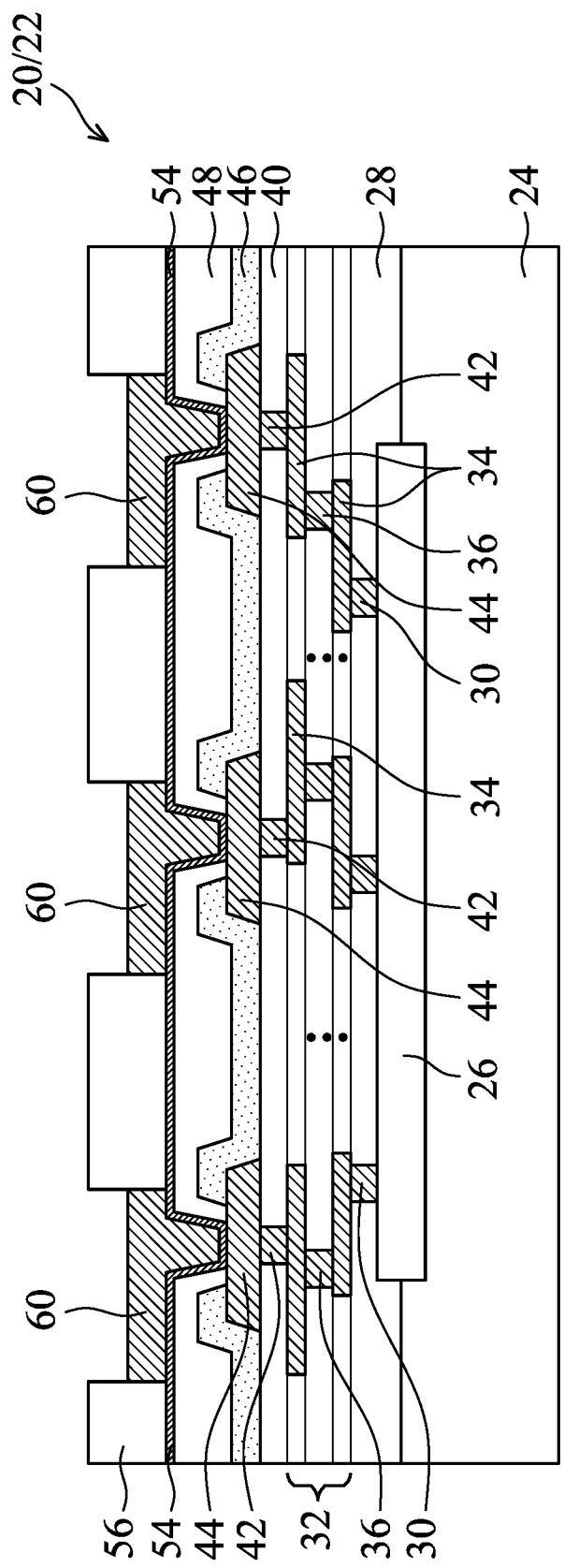
Figure 6:
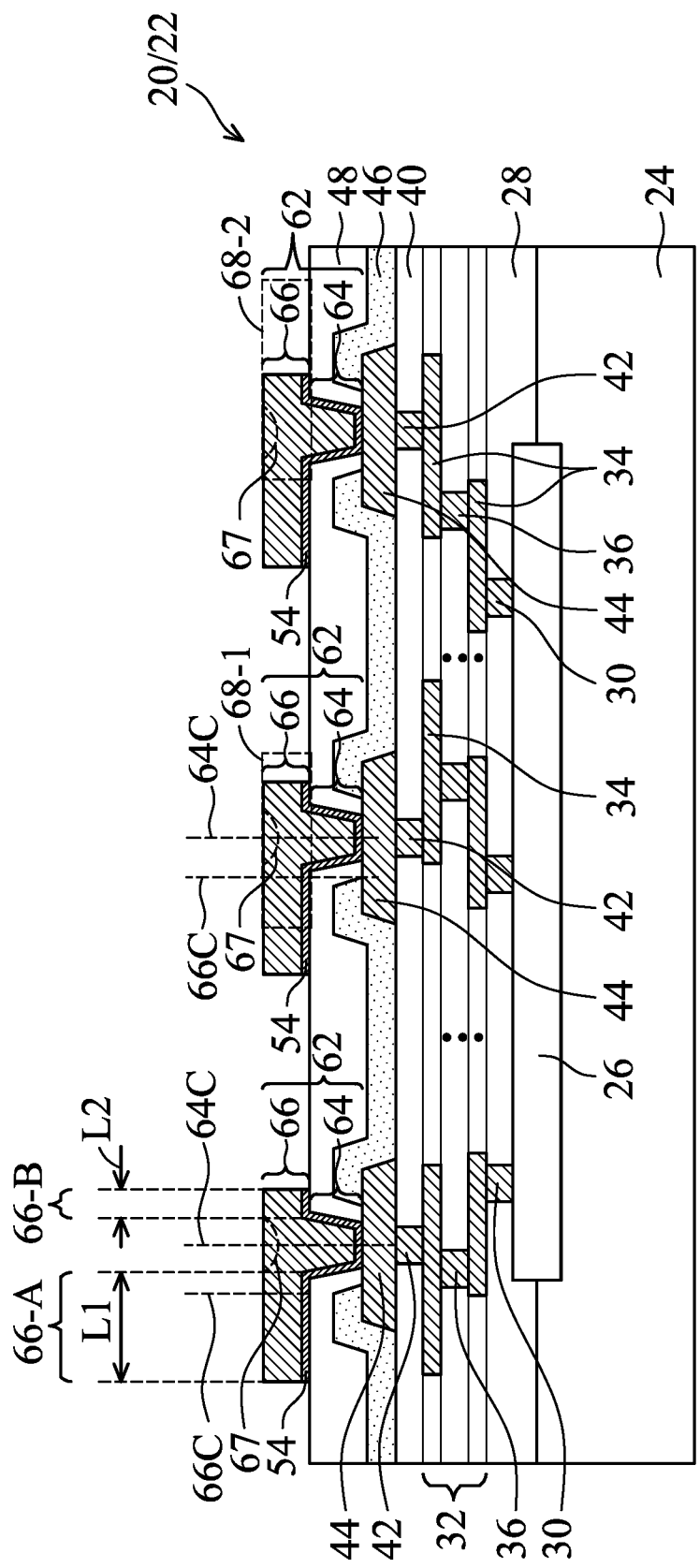

FIGS. 4 through 6 illustrate the formation of vias and the overlying conductive pads. Referring to FIG. 4, metal seed layer 54 is deposited over polymer layer. The respective process is illustrated as process 208 in the process flow 200 as shown in FIG. 16. Metal seed layer 54 is a conductive seed layer, and may be a metal seed layer. In accordance with some embodiments, metal seed layer 54 is a composite layer comprising two or more layers. For example, metal seed layer 54 may include a lower layer and an upper layer, wherein the lower layer may include a titanium layer, a titanium nitride layer, a tantalum layer, a tantalum nitride layer, or the like. The materials of the upper layer may include copper or a copper alloy. In accordance with alternative embodiments, metal seed layer 54 is a single layer, which may be a copper layer, for example. Metal seed layer 54 may be formed using Physical Vapor Deposition (PVD), Plasma Enhanced CVD (PECVD), atomic layer deposition, etc., while other applicable methods may also be used. Metal seed layer 54 is a conformal layer that extends into openings 50.

FIG. 4 also illustrates the formation of a patterned plating mask 56. The respective process is illustrated as process 210 in the process flow 200 as shown in FIG. 16. In accordance with some embodiments, plating mask 56 is formed of or comprises a photo resist. Plating mask 56 is patterned to form openings 58, through which some portions of the metal seed layer 54 are exposed. The patterning of plating mask 56 may include a light-exposure process and a development process.

FIG. 5 illustrates the plating of conductive material (features) 60 into openings 58 and on metal seed layer 54. The respective process is illustrated as process 212 in the process flow 200 as shown in FIG. 16. In accordance with some embodiments, the formation of conductive features 60 includes a plating process, which may include an electrochemical plating process, an electroless plating process, or the like. The plating may be performed in a plating chemical solution. Conductive features 60 may include copper, aluminum, nickel, tungsten, or the like, alloys thereof, and/or multi-layers thereof. In accordance with some embodiments, conductive features 60 comprise copper, and are free from aluminum.

Next, plating mask 56 as shown in FIG. 5 is removed, and the underlying portions of metal seed layer 54 are exposed. In a subsequent process, an etching process is performed to remove the exposed portions of metal seed layer 54. The respective process is illustrated as process 214 in the process flow 200 as shown in FIG. 16. The resulting structure is shown in FIG. 6. Throughout the description, conductive material 60 and the corresponding underlying portions of metal seed layer 54 are collectively referred to Redistribution Lines (RDLs) 62. Each of RDLs 62 may include a via portion 64 (also referred to as a via or a conductive via) extending into polymer layer 48, and pad portion 66 (also referred to as a conductive pad or a metal pad) over polymer layer 48. In accordance with some embodiments, conductive pads 66 have planar top surfaces. In accordance with alternative embodiments, due to the plating process, the top surfaces of conductive pads 66 have recesses directly over the respective conductive vias 64, wherein dashed lines 67 are used to represent the recessed top surfaces of conductive pads 66.

Vias 64 have centers 64C, and conductive pads 66 have centers 66C. In accordance with some embodiments, some or all of conductive pads 66 are laterally shifted from the respective underlying conductive vias 64, which means that the centers 66C of some or all of conductive pads 66 are laterally shifted from the centers 64C of the respective underlying conductive vias 64. In accordance with some embodiments, a conductive pad 66 includes a first portion 66A and a second portion 66B, which are located on opposite sides (for example, the illustrated left and right sides) of the respective conductive via 64. The first portion 66A and the second portion 66B are the portions extending laterally beyond the respective edges of the underlying conductive via 64.

The first portion 66A and the second portion 66B have lateral extending distance L1 and L2, respectively. In accordance with some embodiments, lateral extending distance L1 is greater than lateral extending distance L2, wherein lateral extending distance L1 may be the maximum distance that conductive pad 66 extends beyond the respective underlying conductive via 64, as can be realized from FIGS. 11A, 11B, 11C, 11D, and 13. Lateral extending distance L2 may be the minimum distance that conductive pad 66 extends beyond the respective underlying conductive via 64. Both of lateral extending distance L1 and L2 have non-zero values.

It is appreciated that stress may be generated in device die 22 due to the using of different materials, which have different Coefficients of Thermal Extension (CTEs). Also, there is density difference in the materials, also causing the stress. It has been found that the stress results in the warpage of the resulting device die/wafer and package. The warpage may further result in the cracking of RDLs 62, and may result in delamination between different layers such as between passivation layer 46 and polymer layer 48. By laterally shifting conductive pads 66 from the respective conductive vias 64, conductive pads 66 have arms having different lengths L1 and L2, which are different from each other. This helps to reduce the stress. On the other hand, it has been found that if conductive pads 66 extend symmetrically from the respective conductive vias 64, there is no effect of reducing stress, and cracks and delamination may occur.

To maximize the effect in reducing stress, lateral extending distances L1 and L2 have non-zero values. Otherwise, there is no arms for reducing the stress. In accordance with some embodiments, both of lateral extending distance L1 and lateral extending distance L2 are greater than about 0.5 µm, and may be greater than about 1 µm, 2 µm or 5 µm. Furthermore, the difference (L1−L2) of lateral extending distances L1 and L2 is big enough so that the effect in reducing stress is strong enough. In accordance with some embodiments, ratio L1/L2 is greater than about 1.2, greater than about 1.5, or greater than about 2.0. Ratio L1/L2 may also be in the range between about 1.2 and about 10. Length difference (L1−L2) is greater than about 0.5 µm and may be greater than about 1 µm, 2 µm, or 5 µm and may be in the range between about 1 µm and about 20 µm.

In accordance with some embodiments, in a device die 22, all of the conductive pads 66 are laterally shifted from the respective underlying conductive vias 64. In accordance with alternative embodiments, some of the conductive pads 66 are laterally shifted from the respective underlying conductive vias 64. Some other conductive pads 66, however, are not laterally shifted, and are vertically aligned to the respective underlying conductive vias 64, which means centers 66C of the conductive pads 66 overlap (are at the same positions as) the centers 64C of the respective underlying conductive vias 64. For example, dashed line 68-1 schematically illustrates a position of one of conductive pads 66 that is not laterally shifted from the respective underlying conductive via 64.

Conductive pads 66 in the same device die 22 may also be shifted in the same or different directions relative to the respective underlying conductive vias 64. For example, FIG. 6 illustrates that some of conductive pads 66 (as represented by the conductive pad 66 on the left of figure) are laterally shifted to the left, while some other conductive pads 66 (as represented using dashed lines 68-2) may be shifted to the right.

Figure 7:
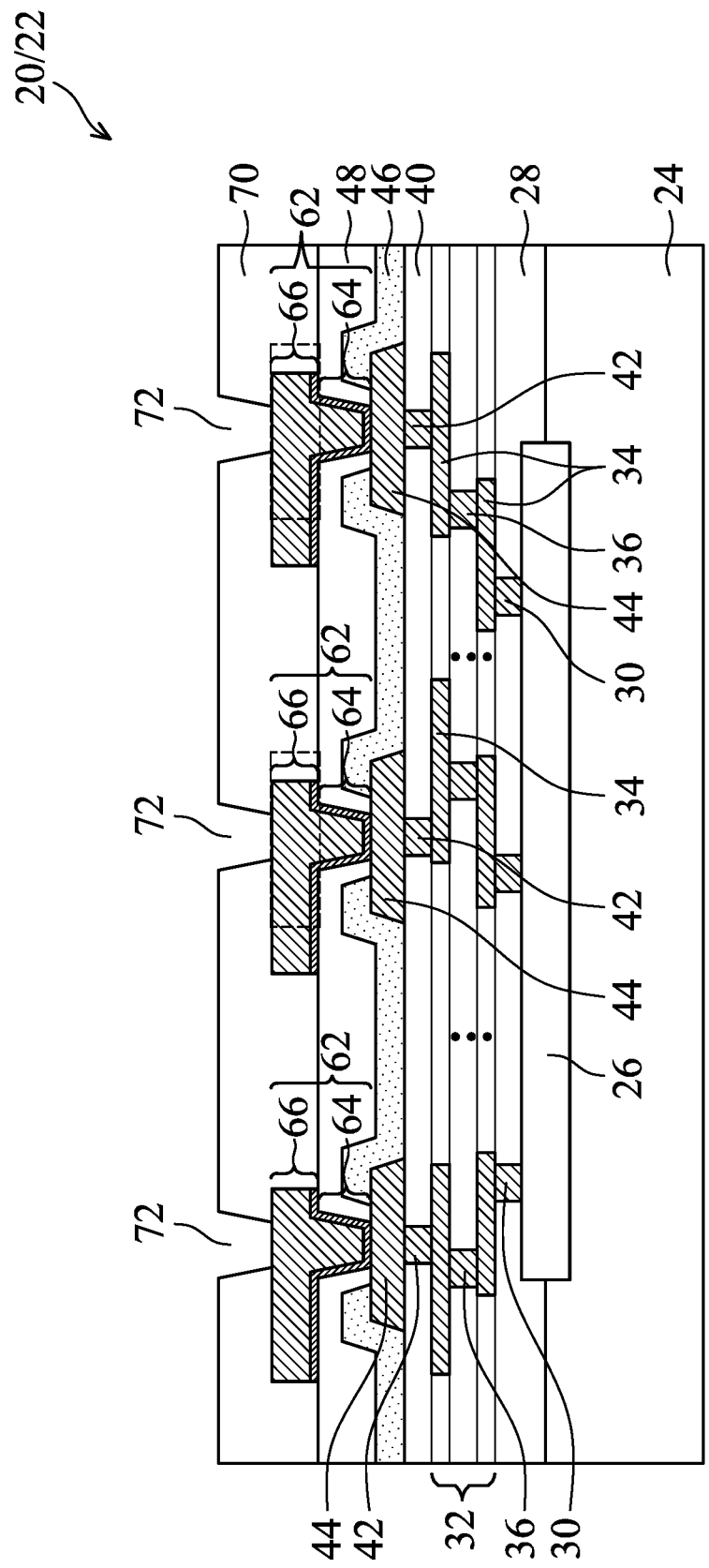

FIG. 7 illustrates the formation of dielectric layer 70. In accordance with some embodiments, dielectric layer 70 is a polymer layer formed of or comprising a polymer (which may be photo-sensitive) such as polyimide, PBO, BCB, an epoxy, or the like. The respective process is illustrated as process 216 in the process flow 200 as shown in FIG. 16. In accordance with some embodiments, the formation of dielectric layer 70 includes coating the dielectric layer in a flowable form, and then performing a curing process to harden dielectric layer 70. A planarization process such as a mechanical grinding process may be (or may not be) performed to level the top surface of dielectric layer 70. Accordingly, dielectric layer 70 is also referred to as a planarization layer. In accordance with alternative embodiments, no planarization process is performed, and the top surface of dielectric layer 70 may have a topology.

In a subsequent process, dielectric layer 70 is patterned, for example, through a light-exposure process followed by a photo-development process. Openings 72 are thus formed in dielectric layer 70, and conductive pads 66 are exposed.

Figure 8:
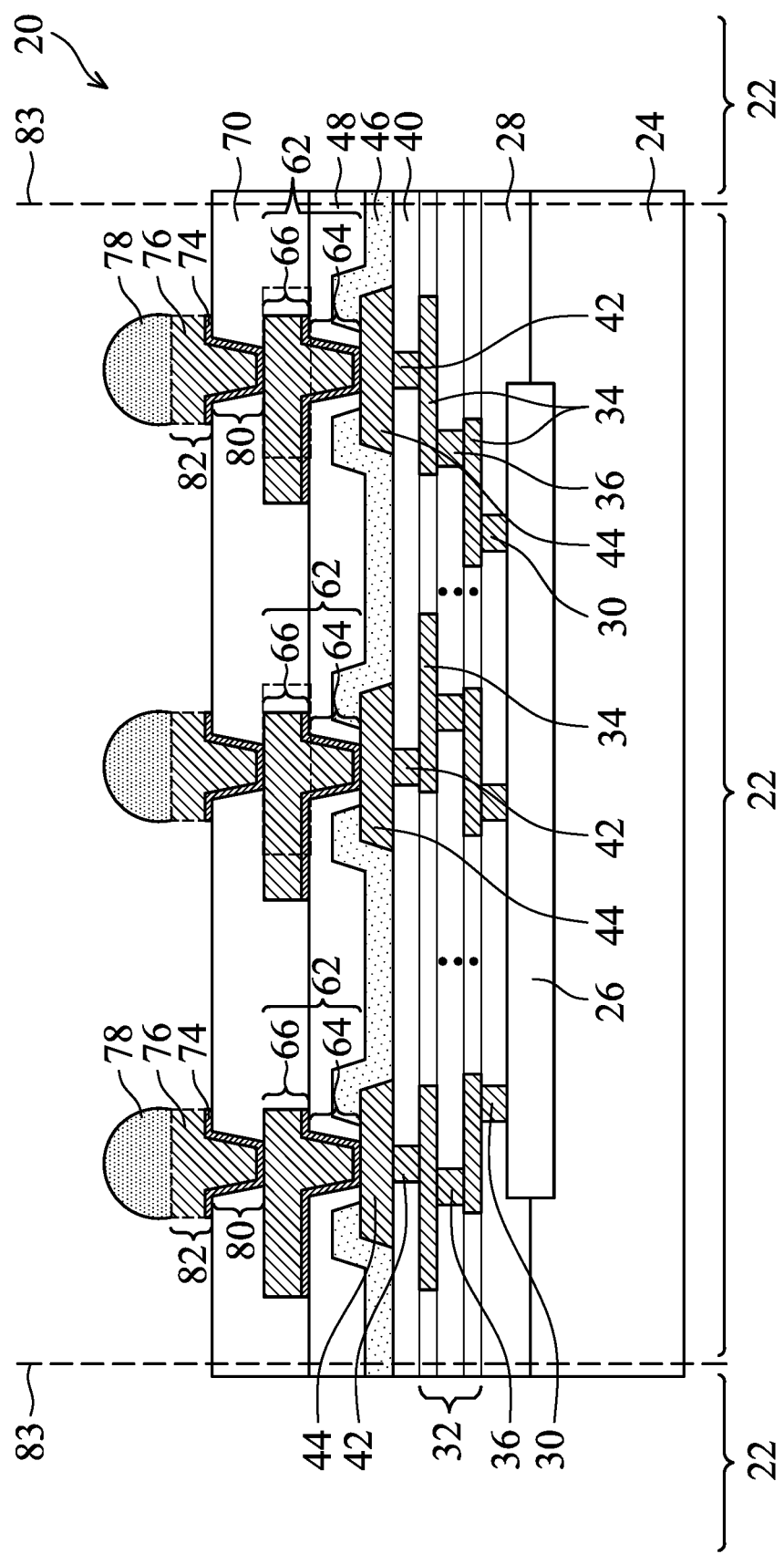

FIG. 8 illustrates the formation of UBMs, and the formation of metal pillars and solder regions (if formed) in accordance with some embodiments. The respective process is illustrated as process 218 in the process flow 200 as shown in FIG. 16. In an example formation process, metal seed layer 74 is deposited as a blanket layer, wherein FIG. 8 illustrates some remaining portions of the blanket seed layer 74. In accordance with some embodiments, metal seed layer 74 comprises a titanium layer and a copper layer over the titanium layer. In accordance with alternative embodiments, the entire metal seed layer 74 is formed of a homogeneous material such as copper or a copper alloy, with the homogenous material being in contact with dielectric layer 70 and the top surface of conductive pads 66. Metal seed layer 74 may be formed through PVD, ALD, or the like.

Next, conductive material 76 is plated. The process for plating conductive material 76 may include forming a patterned plating mask (for example, a photo resist, not shown), and plating conductive material 76 in the openings in the patterned plating mask. Conductive material 76 may comprise copper, nickel, palladium, aluminum, alloys thereof, and/or multi-layers thereof. In accordance with some embodiments, solder layers are also plated on conductive material 76 and in the openings in the patterned plating mask. The patterned plating mask is then removed.

Metal seed layer 74 is then etched, and the portions of metal seed layer 74 that are exposed after the removal of the plating mask are removed, while the portions of metal seed layer 74 directly underlying conductive material 76 are left. The resulting structure is shown in FIG. 8. The remaining portion of the metal seed layer are also referred to as Under-Bump Metallurgies (UBMs) 74. UBMs 74 and conductive material 76 in combination form vias 80 and electrical connectors 82 (which are also referred to as metal bumps). In accordance with some embodiments in which solder layers are also formed, a reflow process may be performed after the etching of metal seed layer, so that the solder regions 78 have rounded surfaces.

In accordance with some embodiments, vias 80 are vertically aligned to the respective underlying vias 64. In accordance with alternative embodiments, vias 80 are vertically misaligned (laterally shifted) from the respective underlying vias 64, and may be, or may not be, vertically aligned to the centers of the respective underlying conductive pads 66. In accordance with yet alternative embodiments, vias 80 are vertically misaligned from both of centers 64C of the respective underlying conductive vias 64 and the centers 66C of the respective underlying conductive pads 66.

In accordance with alternative embodiments, the conductive material 76 is not formed. Accordingly, the conductive material 76 as shown in FIG. 8 is illustrated using dashed lines to indicate it may or may not be formed. In the resulting structure, UBMs 74 are exposed. The formation process of the corresponding UBMs 74 may include depositing one or a plurality of metal layers, for example, a titanium layer and a copper layer over the titanium layer, and then patterning the metal layers through lithography processes. Solder regions 78 may be formed directly on UBMs 74, for example, by placing solder balls on UBMs 74, and then performing a reflow process.

In a subsequent process, wafer 20 may be singulated, for example, sawed along scribe lines 83 to form individual device dies 22. The respective process is illustrated as process 220 in the process flow 200 as shown in FIG. 16. In accordance with alternative embodiments, the singulation of wafer 20 is performed at a later stage. Accordingly, process 220 in FIG. 16 is shown as being dashed to indicate it may or may not be performed at this time. Device dies 22 are also referred to as device dies 22 or package components 22 since device dies 22 may be used for bonding to other package components in order to form packages. As aforementioned, device dies 22 may be device dies, interposers, package substrate, packages, or the like.

Figure 9:
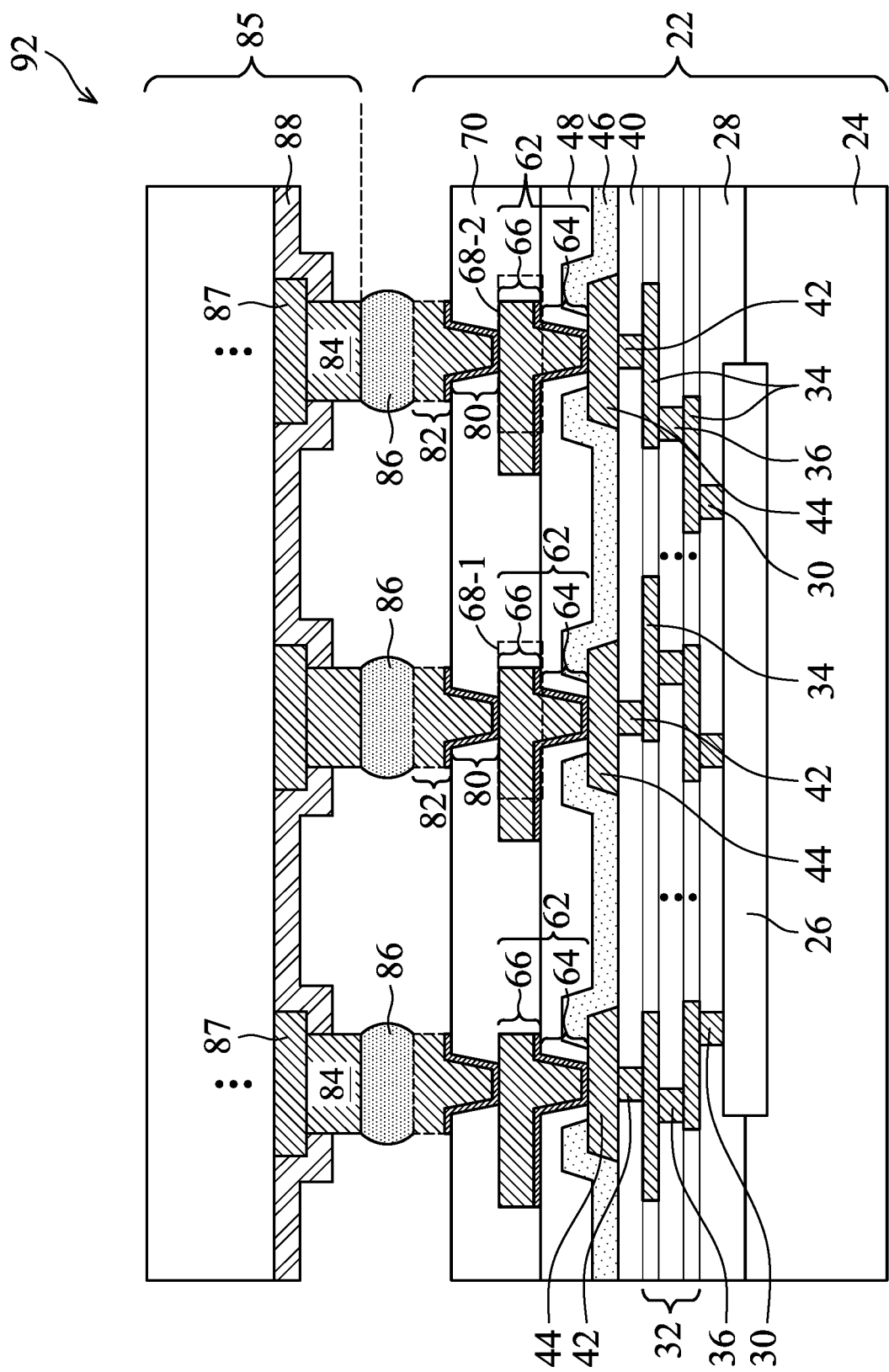

Referring to FIG. 9, device die 22 is bonded with package component 85. The respective process is illustrated as process 222 in the process flow 200 as shown in FIG. 16. In accordance with some embodiments, package component 85 is or comprises a device die (including active devices therein), an interposer, a package substrate, a printed circuit board, a package, or the like. Package component 85 includes electrical connectors 84, which may be metal pillars, bond pads, or the like. Electrical connectors 84 may be formed on metal pads 87, which are partially masked by dielectric layer 88. Electrical connectors 84 in package component 85 may be bonded to device die 22 through solder regions 86. Solder regions 86 may include the solder regions 78 as shown in FIG. 8, and may or may not include additional solder in package component 85.

Figure 10:
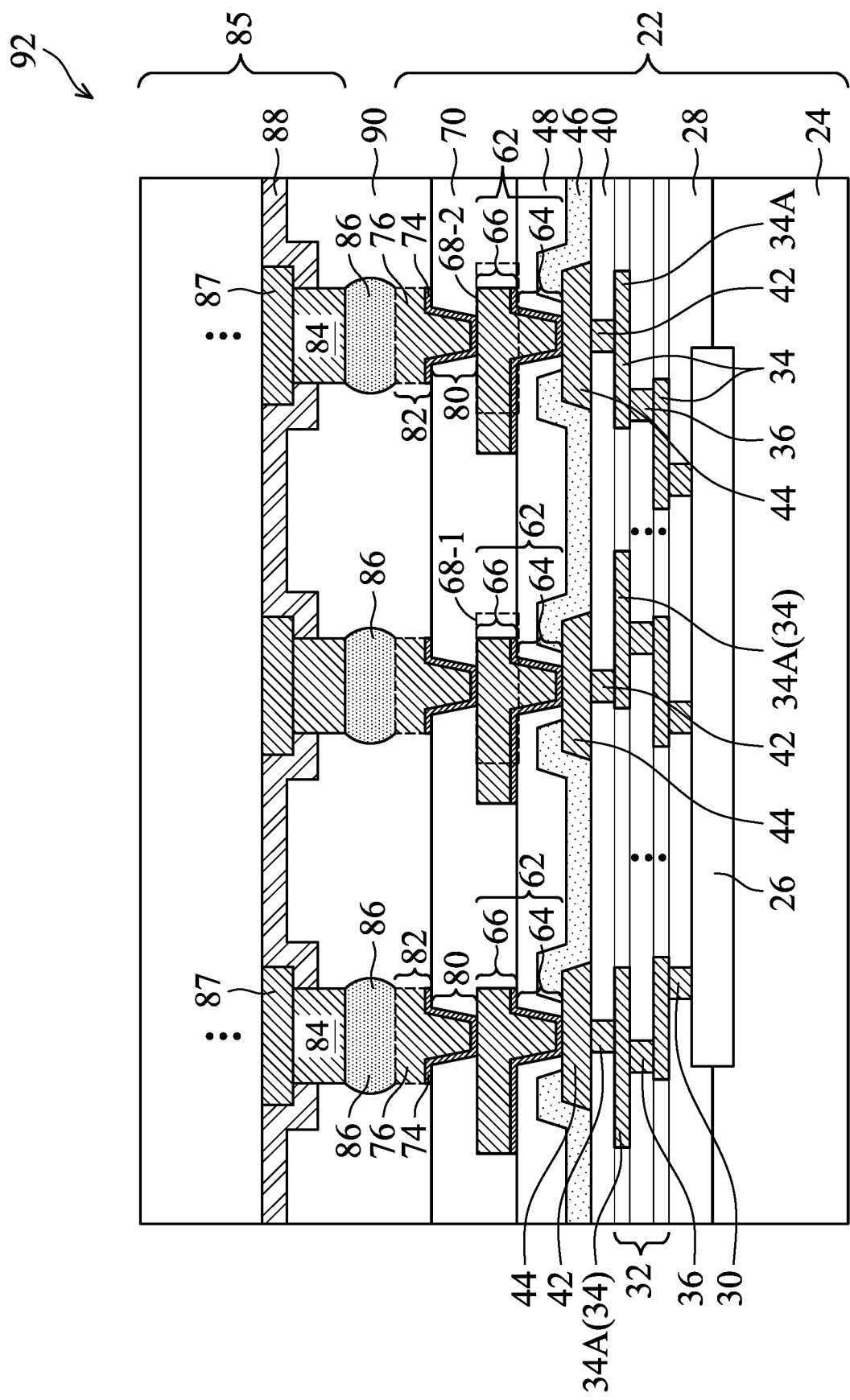

Referring to FIG. 10, Underfill 90 is dispensed between device die 22 and package component 85. The respective process is illustrated as process 224 in the process flow 200 as shown in FIG. 16. Package 92 is thus formed. In accordance with some embodiments, as aforementioned, wafer 20 is sawed before package component 85 is bonded to device die 22. In accordance with alternative embodiments, wafer 20 is not singulated before bonding package component 85. Rather, the package components 85 as shown in FIG. 9 are bonded to device dies 22 in the unsawed wafer 20 through a chip-on-wafer bonding process. The sawing process may be performed after a plurality of package components 85 are bonded to a plurality of device dies 22 in wafer 20. The sawing of wafer 20 may be performed after the dispensing of underfill 90.

FIGS. 11A, 11B, 11C, 11D, 11E, and 11F illustrate the top views of some example conductive pads 66 and vias 64 in accordance with various embodiments. In accordance with some embodiments, each of the conductive pad 66 and its underlying via 64 may have a round top-view shape, a hexagonal top-view shape, an octagonal top-view shape, an oval top-view shape, an elongated hexagonal top-view shape, an elongated octagonal top-view shape, or the like, in any combination. For example, although the figures illustrate that a round top-view shaped conductive pad 66 may be directly over a round top-view shaped conductive via 64, the round top-view shaped conductive pad 66 may alternative be over a hexagonal top-view shaped conductive via 64, an octagonal top-view shaped conductive via 64, an oval top-view shaped conductive via 64, an elongated hexagonal top-view shaped conductive via 64, an elongated octagonal top-view shaped conductive via 64, and vice versa.

FIGS. 11A, 11B, 11C, and 11D illustrate the top views of laterally shifted conductive pads 66 and vias 64. In accordance with some embodiments, the lateral extending distance L1 may be a maximum lateral extending distance. Extending distance L2, on the other hand, may be, or may not be, a minimum extending distance, depending on the shapes and the relative positions of conductive pads 66 and vias 64. In accordance with some embodiments, as shown in FIGS. 11B, 11C, and 11D, the center 64C of the conductive via 64, besides the shifting as illustrated, may be further shifted relative to center 66C of conductive pad 66 in the direction of arrows 69.

In FIG. 11A, both of conductive pad 66 and via 64 have round top-view shapes. The lateral extending distances L1 and L2 are illustrated, wherein lateral extending distances L1 and L2 may be measured along a straight line passing both of centers 64C and 66C. Lateral extending distances L1 and L2 may be measured along a same diameter of the round conductive pad 66.

In FIG. 11B, both of conductive pad 66 and via 64 have hexagonal top-view shapes. Some example lateral extending distance L1 and lateral extending distance L2 are illustrated, wherein lateral extending distances L1 and L2 are measured along a straight line 94 passing through both of centers 64C and 66C. Accordingly, lateral extending distances L1 and L2 may be measured in the directions passing the corners of the hexagons.

FIG. 11C illustrates that conductive pad 66 has an oval top-view shape. In accordance with some embodiments, via 64 is not elongated. In accordance with alternative embodiments, via 64 may also be elongated. In accordance with some embodiments, a line 94 interconnecting centers 64C and 66C will overlap the long axis of the oval, and the lateral extending distances L1 and L2 are measured along the long axis of the oval.

FIG. 11D illustrates that conductive pad 66 and conductive via 64 both have elongated hexagonal top-view shapes. In accordance with alternative embodiments, either conductive pad 66 or conductive via 64 is not elongated.

FIGS. 11E and 11F illustrate the top views of some un-shifted conductive pads 66 and vias 64, wherein the center 66C of conductive pad 66 overlaps the center 64C of the respective conductive via 64. Similarly, either one, or both, of conductive pad 66 and conductive via 64 may be elongated, for example, having the elongated shape as shown in FIGS. 11C and 11D.

FIGS. 12-15 illustrate the top views of one of device die 22 and some example conductive pads 66 and conductive vias 64 in accordance with some embodiments. Although not marked for all conductive pads 66 and conductive vias 64, the larger solid shapes represent the top views of conductive pads 66, and the smaller dashed shapes represent the top views of conductive vias 64. Also, in FIGS. 12-15, conductive pads 66 and conductive vias 64 are shown using round top-view shapes as examples, while the illustrated and discussed top-view shapes as shown in FIGS. 11A, 11B, 11C, 11D, 11E, and 11F may also apply.

In accordance with some embodiments, each conductive pad 66 forms a pair 64/66 with the respective conductive via 64, and die 22 includes a plurality of conductive pad/via pairs 64/66. The plurality of conductive pad/via pairs 64/66 may form arrays. In accordance with some embodiments, centers 66C are aligned to form an array as illustrated in FIGS. 12-15, while centers 64C may be misaligned from the respective centers 66C, and hence may form an array or may not form any array. In accordance with alternative embodiments, centers 64C are aligned to form an array, while centers 66C may be misaligned from the corresponding centers 64C, and hence may form an array or may not form any array.

Figure 12:
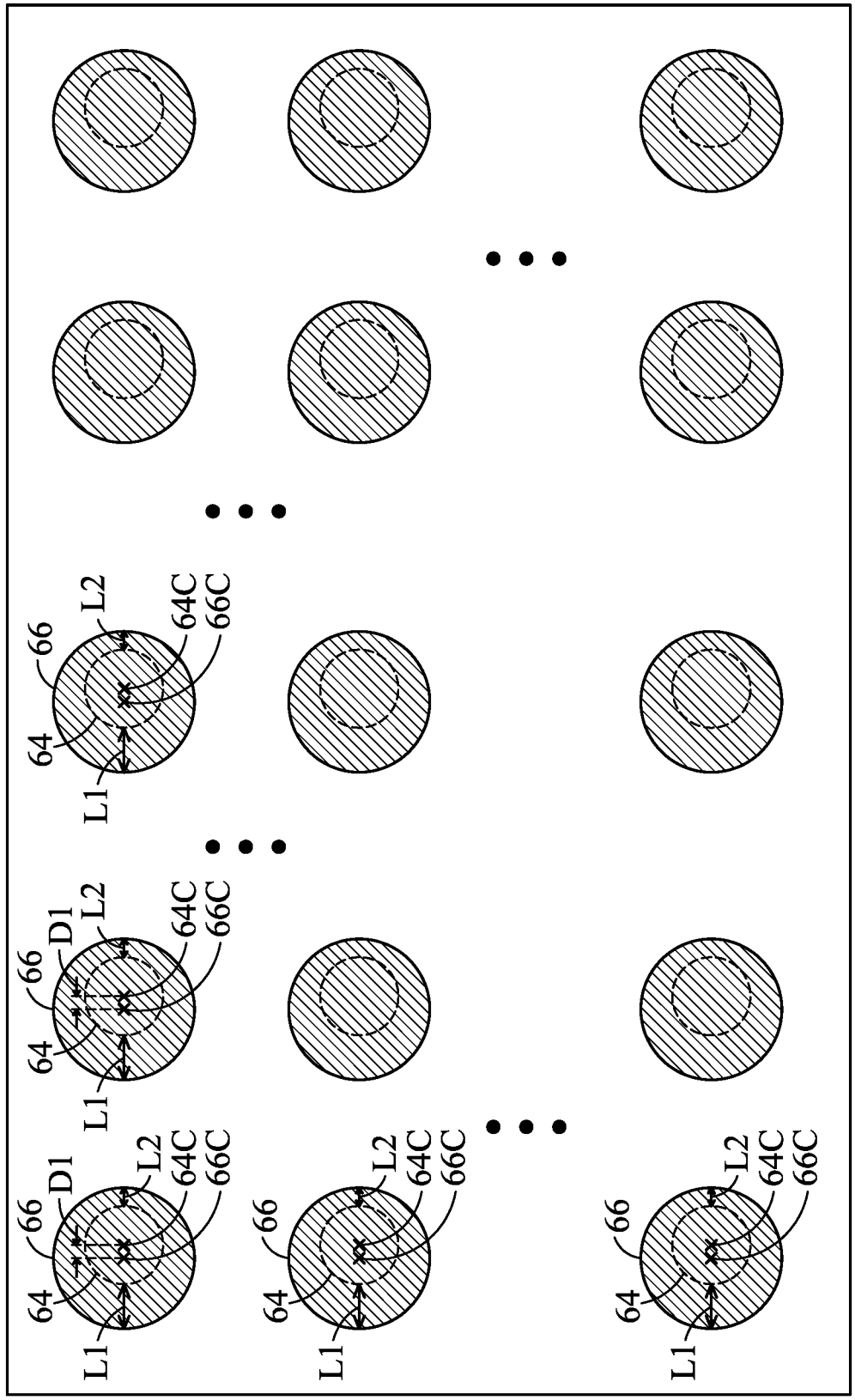
FIGS. 12 through 15 illustrates the top views of vias and conductive pads in a package component in accordance with some embodiments.

Referring to FIG. 12, in accordance with some embodiments, throughout the entire device die 22, all conductive pads 66 are laterally shifted from the respective conductive vias 64. In accordance with some embodiments, all of conductive pads 66 are shifted in a same direction. For example, as illustrated, all of conductive pads 66 may be shifted toward left relative to the respective underlying conductive vias 64. Also, the lateral extending distances L1 and L2 throughout all of conductive pads 66 may be the same as each other. Alternatively stated, the shifting distances D1, which are the distances between corresponding centers 64C and 66C, of different pairs 64/66 may be equal to each other. This setting may simplify the design. In accordance with alternative embodiments, the shifting distances D1 of different pairs 64/66 may be different from each other.

Figure 13:
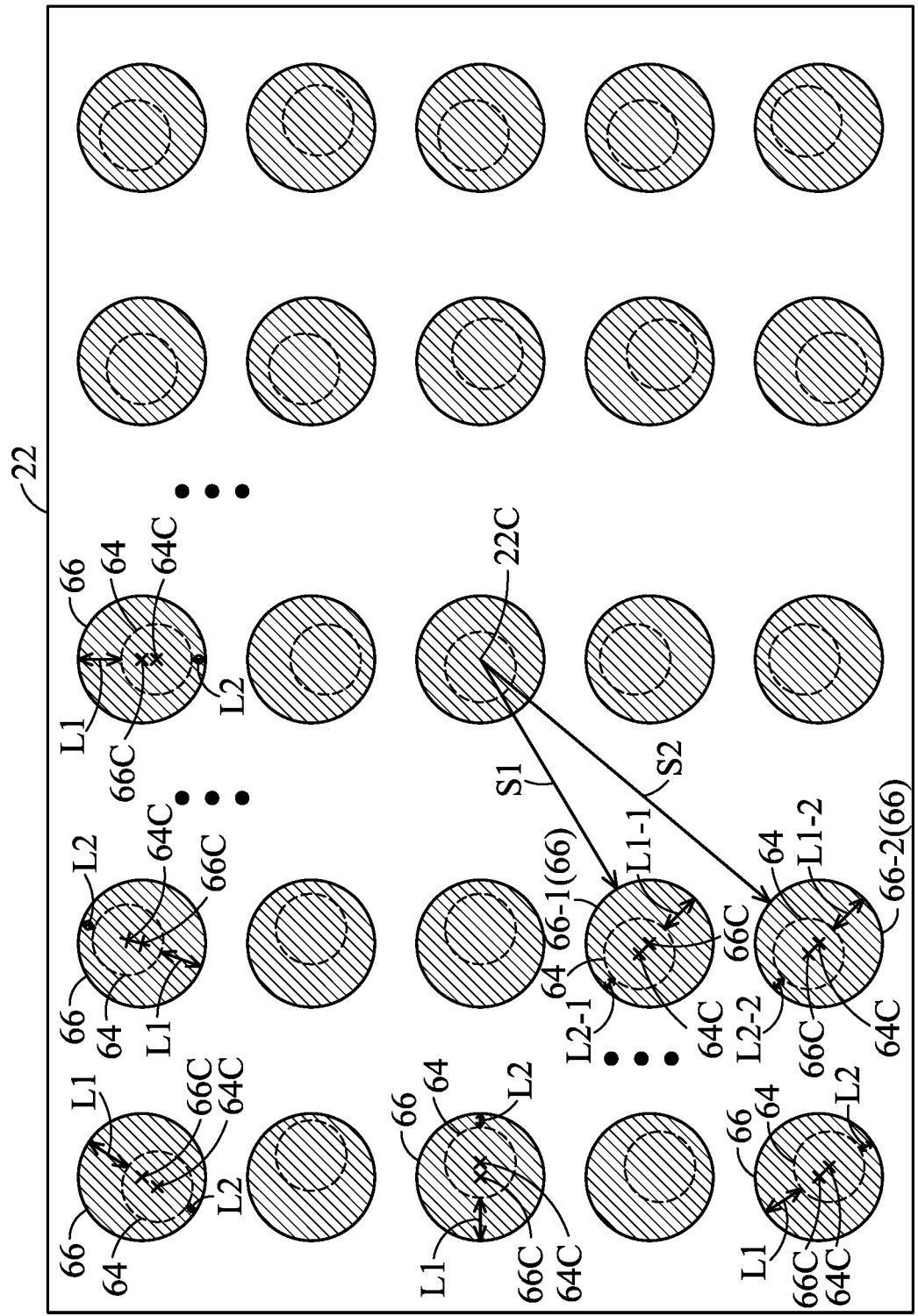

Referring to FIG. 13, in accordance with some embodiments, throughout the entire device die 22, all conductive pads 66 are laterally shifted from the respective conductive vias 64. The shifting directions of conductive pads 66 relative to the corresponding underlying conductive vias 64, however, have a random pattern. For example, some of the lateral extending distances L1 and L2 are illustrated to represent the corresponding shifting directions. In accordance with some embodiments, the lateral extending distances L1 and L2 throughout all of conductive pad/via pairs 64/66 are the same as each other. In accordance with alternative embodiments, the lateral extending distances L1 and L2 of different conductive pad/via pairs 64/66 may be different from each other.

Figure 14:
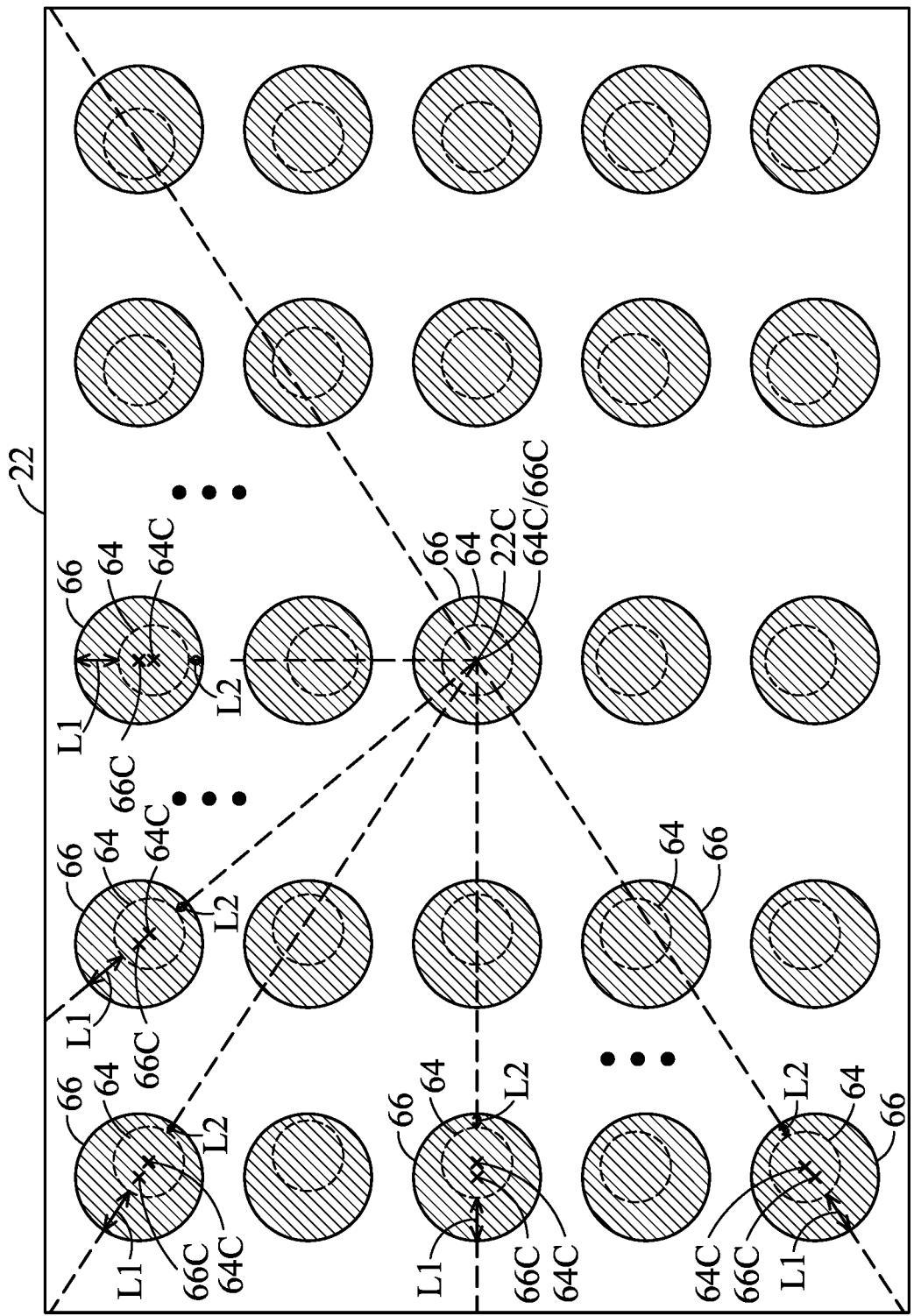

FIG. 14 illustrates an embodiment in which most or all of conductive pads 66 are shifted away in the direction pointing from center 22C of device die 22 to the corresponding conductive pads 66. In accordance with some embodiments, the shifting directions are along the straight lines connecting center 22C to the centers 66C of the respective conductive pads 66. Accordingly, the shifting directions have a radius pattern. When a conductive pad/via pair 64/66 is right at the center 22C of device die 22, the respective conductive pad 66 may be, or may not be, shifted from the respective conductive via 64.

Figure 15:
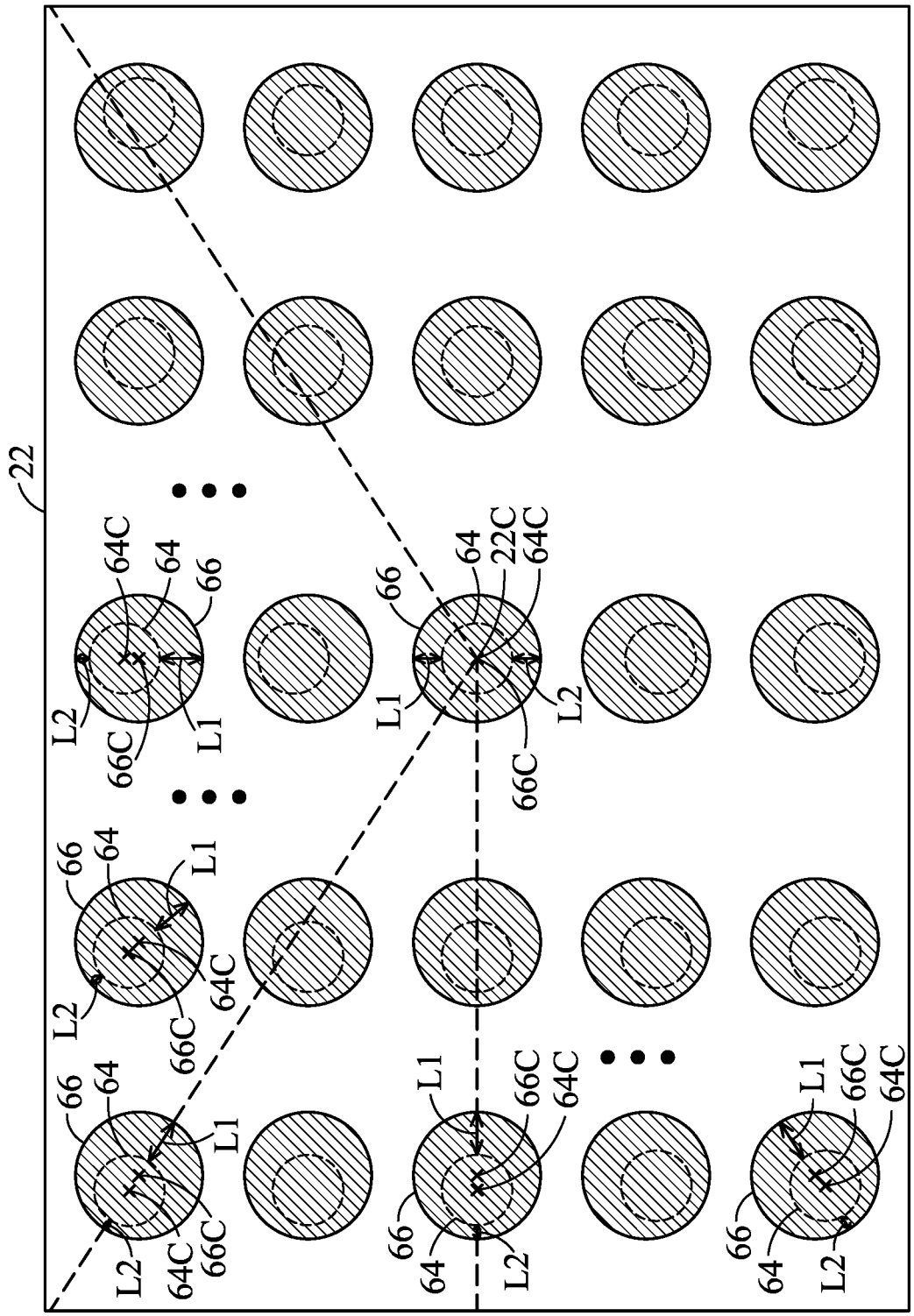

FIG. 15 illustrates an embodiment in which most or all of conductive pads 66 are shifted. These embodiments are similar to the embodiments as shown in FIG. 14, except that conductive pads 66 are shifted away from, rather than toward, center 22C (relative to the respective underlying conductive vias 64). When a conductive pad/via pair 64/66 is right at the center 22C of device die 22, the respective conductive pad 66 may be, or may not be, shifted from the respective conductive via 64.

In each of the embodiments as shown in FIGS. 12 through 15, in accordance with some embodiments, the lateral extending distances L1 and L2 of each of the conductive pads 66 may be equal to the respective lateral extending distances L1 and L2 of all other conductive pads. In accordance with alternative embodiments, the ratio L1/L2 may be related to the distance from the respective conductive pad 66 to center 22C of device die 22. The conductive pads 66 farther away from center 22C may have greater L1/L2 ratio than the conductive pads 66 closer to center 22C. In accordance with some embodiments, the L1/L2 ratio of any conductive pad 66 in a device die may be proportional to its distance to center 22C. For example, as shown in FIG. 13, assuming the distance from center 22C to conductive pads 66-1 and 66-2 are S1 and S2, respectively, the ratio (L1-1/L2-1)/S1 of conductive pad 66-1 is designed to be equal to the ratio (L1-2/L2-2)/S2 of conductive pad 66-2. Since the conductive pads 66 farther away from center 22C may suffer from higher stress due to higher warpage, making the L1/L2 ratio greater for the conductive pads 66 farther from center 22C may improve their ability to absorb stress.

The embodiments of the present disclosure have some advantageous features. By shifting conductive pads relative to the respective underlying conductive vias, the stress applied to the conductive pads and the conductive vias, and to the neighboring dielectric layers such as polymer layers, is reduced. The cracking of the conductive pads and conductive vias is reduced, and the delamination between the neighboring dielectric layers is reduced.

In accordance with some embodiments, a method comprises forming a first polymer layer over a plurality of metal pads; patterning the first polymer layer to form a plurality of openings in the first polymer layer, wherein the plurality of metal pads are exposed through the plurality of openings; forming a plurality of conductive vias in the plurality of openings, and a plurality of conductive pads over and contacting the plurality of conductive vias, wherein a conductive pad in the plurality of conductive pads is laterally shifted from a conductive via directly underlying, and in physical contact with, the conductive pad; and forming a second polymer layer covering and physically contacting the plurality of conductive pads.

In an embodiment, the method further comprises forming a plurality of UBMs extending into the second polymer layer, wherein the plurality of UBMs are in physical contact with top surfaces of the plurality of conductive pads. In an embodiment, the forming the plurality of conductive vias and the plurality of conductive pads comprise depositing a metal seed layer extending into the plurality of openings; forming a patterned mask layer over the metal seed layer; and plating a conductive material into the patterned mask layer and over the metal seed layer. In an embodiment, each of the plurality of conductive pads and the plurality of conductive vias has a top-view shape selected from the group consisting of a circle, a hexagonal shape, and an octagonal shape.

In an embodiment, the method further comprises performing a singulation process to form a die, with the first polymer layer and the second polymer layer being sawed, wherein all of the plurality of conductive pads in the die are laterally shifted from respective underlying ones of the plurality of conductive vias. In an embodiment, all of the plurality of conductive pads in the die are laterally shifted to a same direction relative to the respective underlying ones of the plurality of conductive vias. In an embodiment, all of the plurality of conductive pads in the die are laterally shifted for a same distance relative to the respective underlying ones of the plurality of conductive vias.

In an embodiment, the plurality of conductive pads in the die are laterally shifted in random directions relative to the respective underlying ones of the plurality of conductive vias. In an embodiment, the die has a center, and wherein first ones of the plurality of conductive pads in the die are farther away from the center than second ones of the plurality of conductive pads, and wherein the first ones of the plurality of conductive pads are shifted more than the second ones.

In accordance with some embodiments, a device comprises a plurality of metal pads; a first polymer layer over the plurality of metal pads; a plurality of conductive vias extending into the first polymer layer to contact the plurality of metal pads; a plurality of conductive pads over and contacting the plurality of conductive vias, wherein the plurality of conductive pads are laterally shifted from respective underlying ones of the plurality of conductive vias; and a second polymer layer over and contacting the plurality of conductive pads. In an embodiment, the device further comprises an inorganic passivation layer over the plurality of metal pads and underlying the first polymer layer.

In an embodiment, the device further comprises a plurality of UBMs extending into the second polymer layer, wherein the plurality of UBMs are in physical contact with top surfaces of the plurality of conductive pads. In an embodiment, the plurality of conductive vias and the plurality of conductive pads are in a die, and wherein all of the plurality of conductive pads in the die are laterally shifted from corresponding ones of the plurality of conductive vias. In an embodiment, all of the plurality of conductive pads in the die are laterally shifted to a same direction relative to the corresponding ones of the plurality of conductive vias.

In an embodiment, all of the plurality of conductive pads in the die are laterally shifted for a same distance relative to the corresponding ones of the plurality of conductive vias. In an embodiment, the plurality of conductive pads in the die are laterally shifted in random directions relative to the corresponding ones of the plurality of conductive vias. In an embodiment, the die has a center, and wherein first ones of the plurality of conductive pads in the die are farther away from the center than second ones of the plurality of conductive pads, and wherein the first ones of the plurality of conductive pads are shifted more than the second ones.

In accordance with some embodiments, a device comprises a plurality of metal pads; a first dielectric layer over the plurality of metal pads; a plurality of conductive vias extending into the first dielectric layer to contact the plurality of metal pads; a plurality of conductive pads over and contacting the plurality of conductive vias, wherein the plurality of conductive pads form an array, and wherein first centers of the plurality of conductive pads are laterally shifted from second centers of respective underlying ones of the plurality of conductive vias; and electrical connectors over and contacting the plurality of conductive pads. In an embodiment, the device further comprises solder regions over and contacting the electrical connectors. In an embodiment, all of the first centers are laterally shifted from the second centers in a same direction, and for a same distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first polymer layer over a plurality of metal pads;
   patterning the first polymer layer to form a plurality of openings in the first polymer layer, wherein the plurality of metal pads are exposed through the plurality of openings;
   forming a plurality of conductive vias in the plurality of openings, and a plurality of conductive pads over and contacting the plurality of conductive vias, wherein a conductive pad in the plurality of conductive pads is laterally shifted from a conductive via directly underlying, and in physical contact with, the conductive pad, wherein the forming the plurality of conductive vias and the plurality of conductive pads comprise:
      depositing a metal seed layer extending into the plurality of openings;
      forming a patterned mask layer over the metal seed layer; and
      plating a conductive material into the patterned mask layer and over the metal seed layer; and
   forming a second polymer layer covering and physically contacting the plurality of conductive pads.

2. The method of claim 1 further comprising forming a plurality of Under-Bump Metallurgies (UBMs) extending into the second polymer layer, wherein the plurality of UBMs are in physical contact with top surfaces of the plurality of conductive pads.

3. The method of claim 1, wherein the plurality of conductive vias and the plurality of conductive pads are comprised in a device die.

4. The method of claim 1, wherein each of the plurality of conductive pads and the plurality of conductive vias has a top-view shape selected from the group consisting of a circle, a hexagonal shape, and an octagonal shape.

5. The method of claim 1 further comprising performing a singulation process to form a die, with the first polymer layer and the second polymer layer being sawed, wherein all of the plurality of conductive pads in the die are laterally shifted from respective underlying ones of the plurality of conductive vias.

6. The method of claim 5, wherein all of the plurality of conductive pads in the die are laterally shifted to a same direction relative to the respective underlying ones of the plurality of conductive vias.

7. The method of claim 5, wherein all of the plurality of conductive pads in the die are laterally shifted for a same distance relative to the respective underlying ones of the plurality of conductive vias.

8. The method of claim 5, wherein the plurality of conductive pads in the die are laterally shifted in random directions relative to the respective underlying ones of the plurality of conductive vias.

9. The method of claim 5, wherein the die has a center, and wherein first ones of the plurality of conductive pads in the die are farther away from the center than second ones of the plurality of conductive pads, and wherein the first ones of the plurality of conductive pads are shifted more than the second ones.

10. A device comprising:
    a plurality of metal pads;
    an inorganic passivation layer over the plurality of metal pads;
    a first polymer layer over the inorganic passivation layer;
    a plurality of conductive vias extending into the first polymer layer to contact the plurality of metal pads;
    a plurality of conductive pads over and contacting the plurality of conductive vias, wherein the plurality of conductive pads are laterally shifted from respective underlying ones of the plurality of conductive vias; and
    a second polymer layer over and contacting the plurality of conductive pads.

11. The device of claim 10, wherein the plurality of conductive vias and the plurality of conductive pads are comprised in a device die.

12. The device of claim 10 further comprising a plurality of Under-Bump Metallurgies (UBMs) extending into the second polymer layer, wherein the plurality of UBMs are in physical contact with top surfaces of the plurality of conductive pads.

13. The device of claim 10, wherein the plurality of conductive vias and the plurality of conductive pads are in a die, and wherein all of the plurality of conductive pads in the die are laterally shifted from corresponding ones of the plurality of conductive vias.

14. The device of claim 13, wherein all of the plurality of conductive pads in the die are laterally shifted to a same direction relative to the corresponding ones of the plurality of conductive vias.

15. The device of claim 13, wherein all of the plurality of conductive pads in the die are laterally shifted for a same distance relative to the corresponding ones of the plurality of conductive vias.

16. The device of claim 13, wherein the plurality of conductive pads in the die are laterally shifted in random directions relative to the corresponding ones of the plurality of conductive vias.

17. The device of claim 13, wherein the die has a center, and wherein first ones of the plurality of conductive pads in the die are farther away from the center than second ones of the plurality of conductive pads, and wherein the first ones of the plurality of conductive pads are shifted more than the second ones.

18. A device comprising:
    a plurality of metal pads;
    a first dielectric layer over the plurality of metal pads;
    a plurality of conductive vias extending into the first dielectric layer to contact the plurality of metal pads;
    a plurality of conductive pads over and contacting the plurality of conductive vias, wherein the plurality of conductive pads form an array, wherein the plurality of conductive vias and the plurality of conductive pads are in a die, and wherein all of the plurality of conductive pads in the die are laterally shifted from corresponding ones of the plurality of conductive vias; and
    electrical connectors over and contacting the plurality of conductive pads.

19. The device of claim 18 further comprising solder regions over and contacting the electrical connectors.

20. The device of claim 18, wherein all of the plurality of conductive pads are laterally shifted from corresponding ones of the plurality of conductive vias in a same direction, and for a same distance.

* * * * *